US012652784B2

(12) United States Patent
Cheong et al.

(10) Patent No.: US 12,652,784 B2
(45) Date of Patent: Jun. 9, 2026

(54) SYSTEM FOR HEAT REMOVAL FROM SERVER RACKS

(71) Applicant: KOOLLOGIX PTE. LTD., Singapore (SG)

(72) Inventors: Chun Keat Cheong, Singapore (SG); Seri Lee, Beaverton, OR (US)

(73) Assignee: KOOLLOGIX PTE. LTD., Singapore (SG)

( * ) Notice: Subject to any disclaimer, the term of this patent is extended or adjusted under 35 U.S.C. 154(b) by 272 days.

(21) Appl. No.: 18/562,908

(22) PCT Filed: Mar. 14, 2022

(86) PCT No.: PCT/IB2022/052247
§ 371 (c)(1),
(2) Date: Nov. 21, 2023

(87) PCT Pub. No.: WO2022/248945
PCT Pub. Date: Dec. 1, 2022

(65) Prior Publication Data
US 2024/0224474 A1      Jul. 4, 2024

(30) Foreign Application Priority Data

May 27, 2021    (SG) ........................... 10202105627X

(51) Int. Cl.
*H05K 7/20*                (2006.01)
(52) U.S. Cl.
CPC ..... *H05K 7/20736* (2013.01); *H05K 7/20145* (2013.01); *H05K 7/20172* (2013.01)
(58) Field of Classification Search
CPC ............. H05K 7/20172; H05K 7/1488; H05K 7/20718; H05K 7/20781; H05K 7/20818; H05K 5/03; H05K 7/20136; H05K 7/20145; H05K 7/20181; H05K 9/0041; G06F 1/20
USPC ......................................................... 361/695
See application file for complete search history.

(56) References Cited

U.S. PATENT DOCUMENTS

| | | | | |
|---|---|---|---|---|
| 5,467,250 A | * | 11/1995 | Howard | ................. H05K 7/206 165/122 |
| 2008/0239668 A1 | * | 10/2008 | Hendrix | ............. H05K 7/20563 361/695 |
| 2010/0111533 A1 | * | 5/2010 | Beckett | ............... H04J 14/0282 398/68 |

(Continued)

FOREIGN PATENT DOCUMENTS

| | | |
|---|---|---|
| JP | 2009135280 A | 6/2009 |
| JP | 2009266914 A | 11/2009 |
| JP | 2010267841 A | 11/2010 |

OTHER PUBLICATIONS

International Search Report and Written Opinion issued in PCT/IB2022/052247, dated Jun. 17, 2022, 10 pages provided.

*Primary Examiner* — Mandeep S Buttar
(74) *Attorney, Agent, or Firm* — HSML P.C.

(57) ABSTRACT

Embodiments of the present invention herein generally relate to a system for heat removal from server racks of data centre, wherein the system comprising a back panel, at least a heat exchanger provided within the back panel, at least one exhaust fan, and at least one second layer covering said back panel wherein said second layer comprises of a plurality of perforations to allow air to disperse from said server rack used for storing servers through said back panel.

6 Claims, 4 Drawing Sheets

(56) References Cited

U.S. PATENT DOCUMENTS

2016/0066478 A1 *  3/2016  Van Den Bergen ........................
                                      H05K 7/20754
                                      361/679.47
2016/0215999 A1 *  7/2016  Bard .................. H05K 7/20736

* cited by examiner

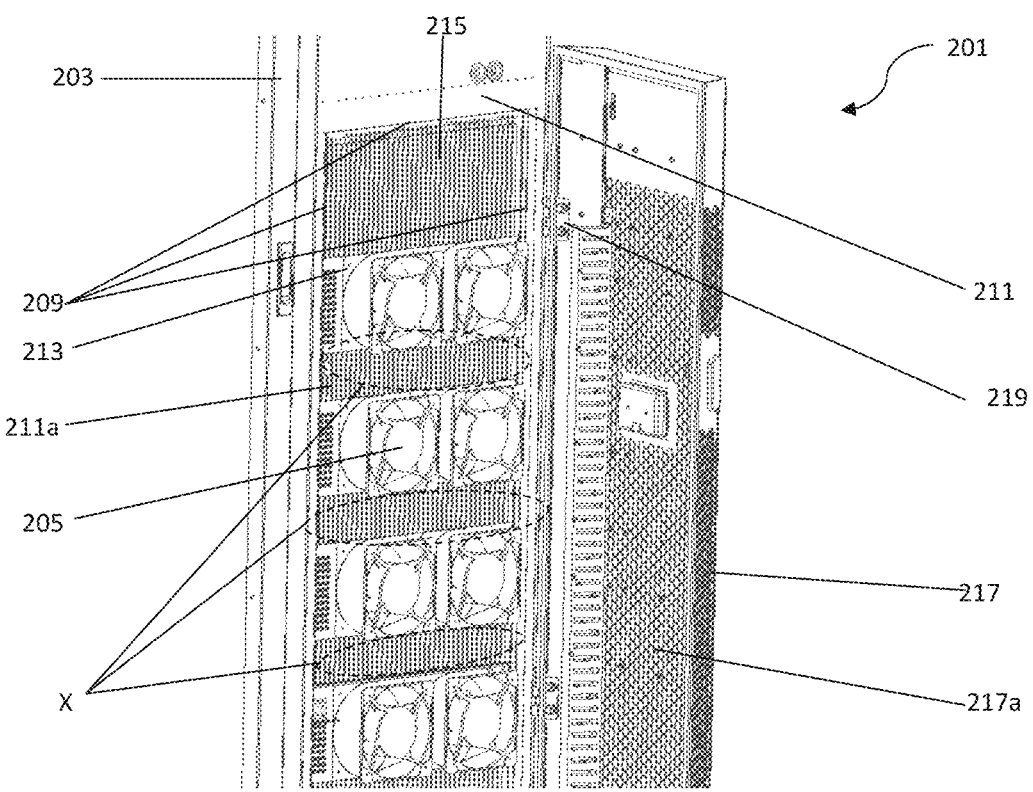
FIG. 3
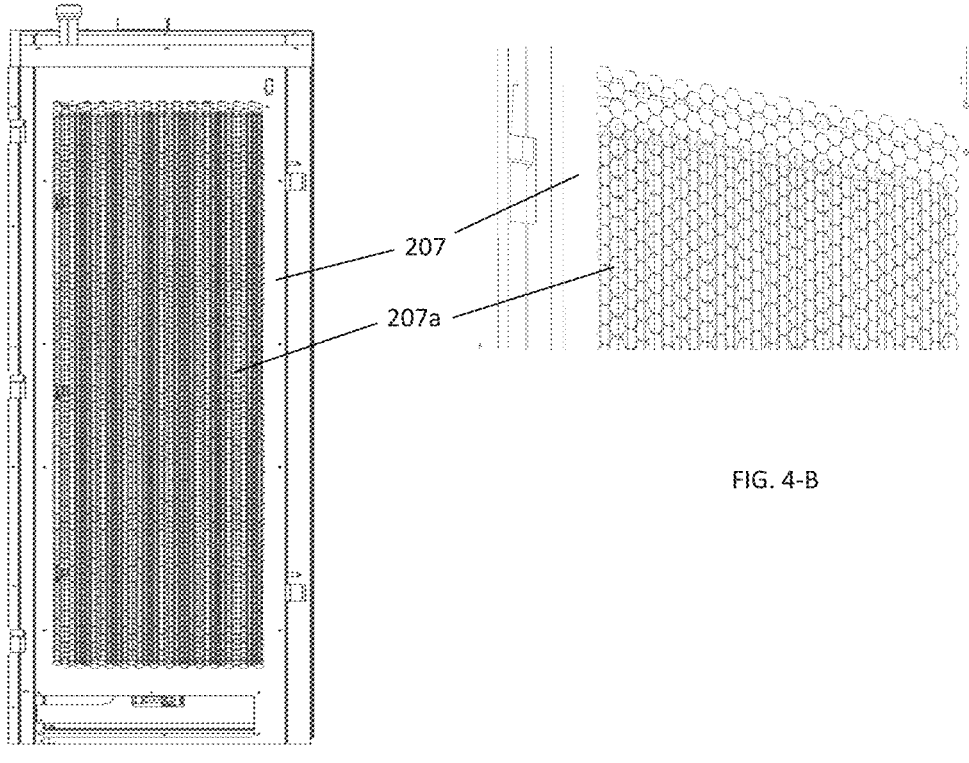
FIG. 4-A
FIG. 4-B

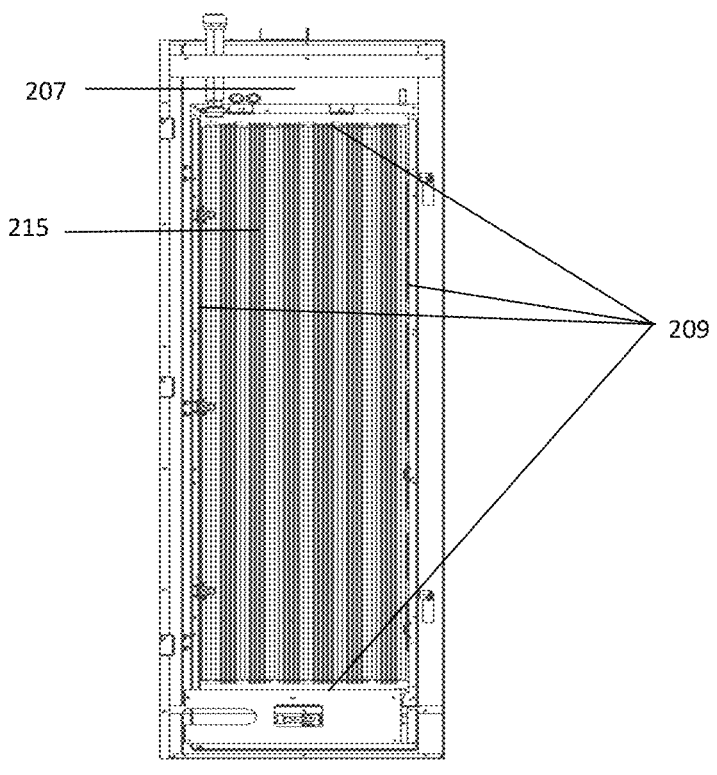
FIG. 4-C
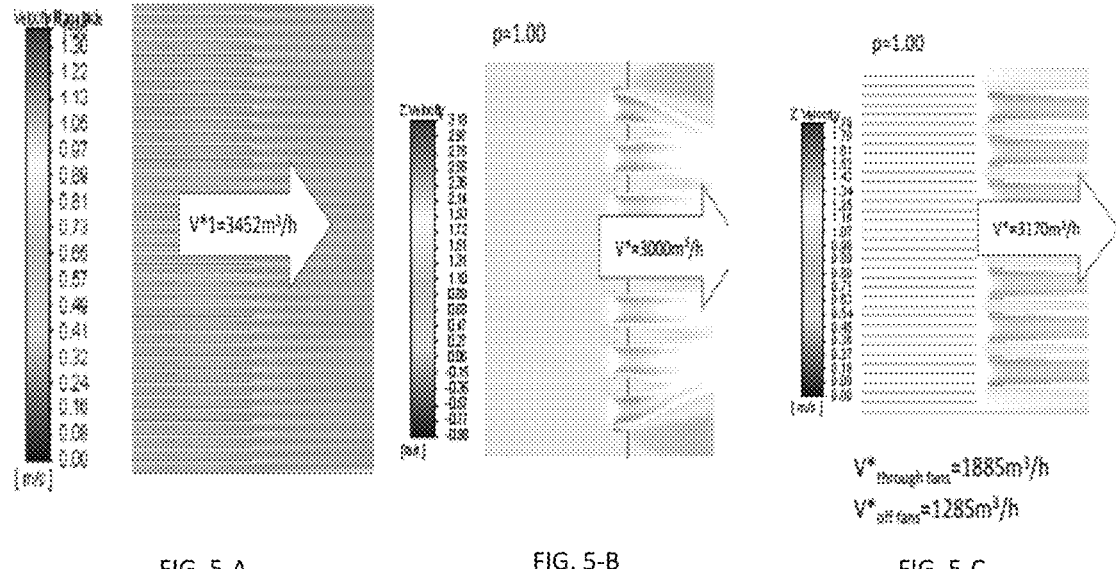
FIG. 5-A                    FIG. 5-B                    FIG. 5-C

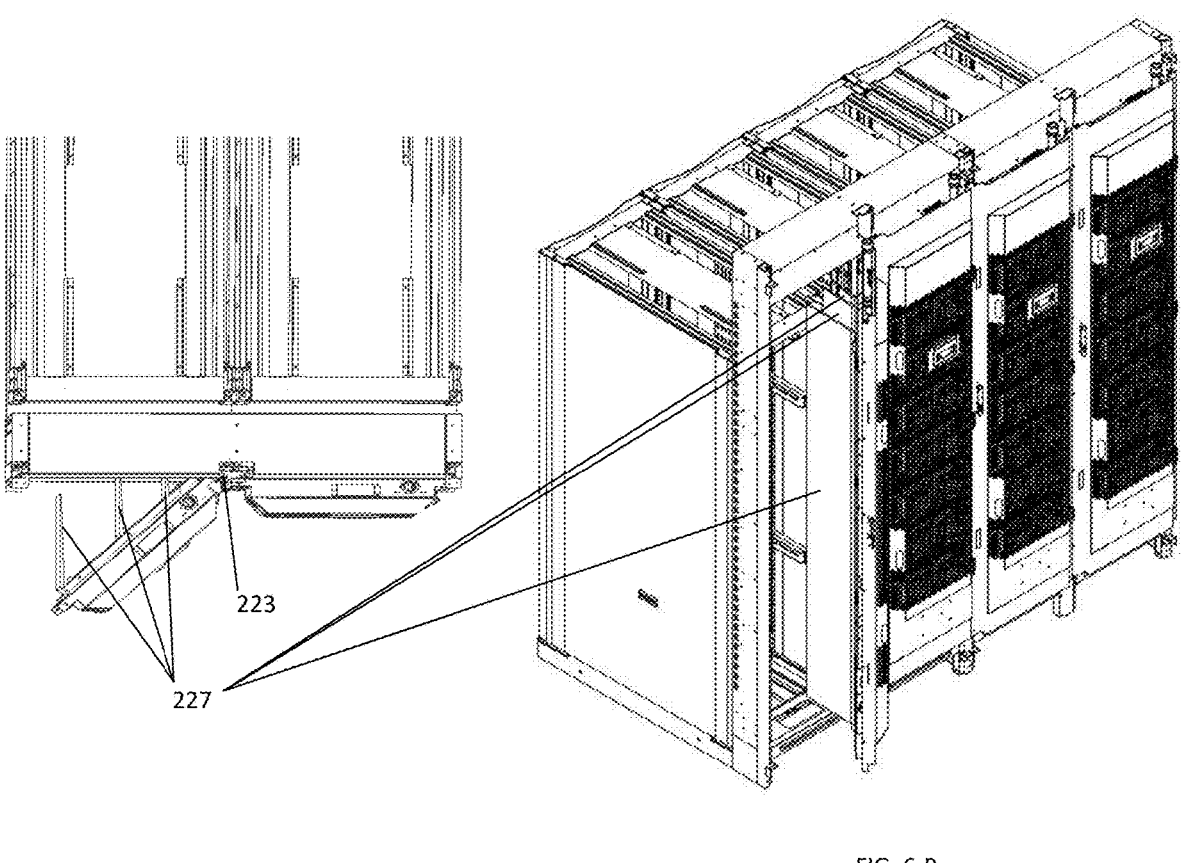
FIG. 6-A                  FIG. 6-B

SYSTEM FOR HEAT REMOVAL FROM SERVER RACKS

TECHNICAL FIELD OF THE INVENTION

The present invention generally relates to a system for heat removal from server racks of data centre.

BACKGROUND OF THE INVENTION

Business models, organizations, enterprises or even individuals tend to generate, create and collect volume of information data in variety formats and from variety sources. Such data is huge in size and yet growing exponentially with time which inundates a business on a day-to-day basis because none of the traditional data management tools are able to store it or process it efficiently. Hence, server system was developed to keep up the pace with technology advancement and globalization as it not only processes the large volume of information data as well as speeds up the whole operating efficiency in order to solve the problems faced by the business organizations.

Server system, by its nature, is operated continuously, for long hours or even without stopping or pausing for certain organizations, which generates a great deal of heat, and is sensitive to heat, humidity, and dust. Maintaining a stable temperature, humidity and air flow within tight tolerances is critical to a server system. However, conventional server systems typically do not have a good heat dissipation system to cool the entire server system nor an air flow management system to manage the air flow distribution and circulation within a data centre, hence affecting the operation of the server system or the data centre. Examples of conventional server system are illustrated in FIGS. 1-A and 1-B wherein the back panel of these server systems are provided with the conventional heat removal systems, which are either a heat exchanger or some exhaust fans fixedly attached on the back panel.

A problem of the conventional server systems, in particularly the heat removal system with the exhaust fans as illustrated in FIG. 1-B, is that the back are covered or concealed with solid panel which have impeded the air flow environment, and hence requires large capacity and powerful exhaust fans to facilitate air flow, remove heat from back of the server racks and reduce the temperature of said server racks, wherein such exhaust fan is high in power consumption which inevitably resulted in high power bills. Furthermore, such exhaust fans are easily broken and require regular maintenance, which further resulted in the increase of cost. Moreover, this type of heat removal system is highly inefficient as the air flow from the upstream or downstream of the exhaust fans is still impeded.

Another problem of the conventional server systems, in particularly the system with the heat exchanger as illustrated in FIG. 1-A, is the absence of air flow managing system. Although this kind of system relies on the heat exchanger to remove the heat, but without an effective air flow management the air movement is impeded. As hot air is generated and distributed in every single part of the space in the server racks, the heat exchanger is only able to remove the heat from their nearest space but are not able to remove the heat or the hot air from each part of the space in the server racks structurally and completely or in an efficient manner, thereby rendering a worst air flow environment. The heat may recirculate within the server racks and the servers may be overheated which may ruin the servers.

Another problem of the conventional server systems is that when the back panel of the server racks are being opened for maintenance or check-up, heat will not be dissipated as much as compared to when the back panel is closed. This is because when the back panel is opened, the heat removal system is far off the server rack and the hot air generated from the servers is leaking out to the environment directly rather than flowing through the heat removal system. This may cause the temperature of the data centre of server room to increase when the back panel is opened, as the hot air exiting the server racks bypassed the heat removal system.

Therefore, there is a crucial need to alleviate the above shortcomings by having the following disclosure therein.

SUMMARY OF THE INVENTION

Accordingly, it is the primary aim of the present invention to provide a system for heat removal from server racks wherein the system can effectively remove heat from server racks.

It is yet another objective of the present invention to provide a system for heat removal from server racks wherein the system is able to provide efficient air flow or to supplement air flow.

It is yet another objective of the present invention to provide a system for heat removal from server racks wherein the system is low in power consumption while maintaining great air flow rate.

It is yet another objective of the present invention to provide a system for heat removal from server racks wherein the heat from the server racks can be guided through the heat removal system before flowing to the environment when the server racks are opened for maintenance.

Additional objects of the invention will become apparent with an understanding of the following detailed description of the invention or upon employment of the invention in actual practice.

According to the preferred embodiment of the present invention the following is provided:

A system for heat removal from server racks, comprising:
a back panel comprises of an inner wall, a plurality of side walls, an outer wall and at least one exhaust fan;
characterized in that
said back panel further comprises of at least one second layer covering said back panel;
said second layer comprises of a plurality of perforations to allow air to disperse from said server rack through said back panel.

BRIEF DESCRIPTION OF THE DRAWINGS

Other aspects of the present invention and their advantages will be discerned after studying the Detailed Description in conjunction with the accompanying drawings in which:

FIGS. 1-A and 1-B illustrate the conventional heat removal systems of server racks.

FIG. 3 illustrates an exemplary front-open view of the system for heat removal from server racks according to the preferred embodiment of the present invention.

FIG. 4-A illustrates an exemplary back view of the system for heat removal from server racks according to the preferred embodiment of the present invention.

FIG. 4-B illustrates an exemplary enlarged view of a portion of FIG. 4-A.

FIG. 4-C illustrates an exemplary view of FIG. 4-A with a layer removed.

FIGS. 5-A, 5-B and 5-C illustrate the air flow velocity distribution of a server rack without heat removal system, a server rack with heat removal system as employed in FIG. 1-B and a server rack with the employment of present invention respectively.

FIGS. 6-A and 6-B illustrate the system for heat removal from server racks according to another embodiment of the present invention.

DETAILED DESCRIPTION OF THE DRAWINGS

Figure 2:
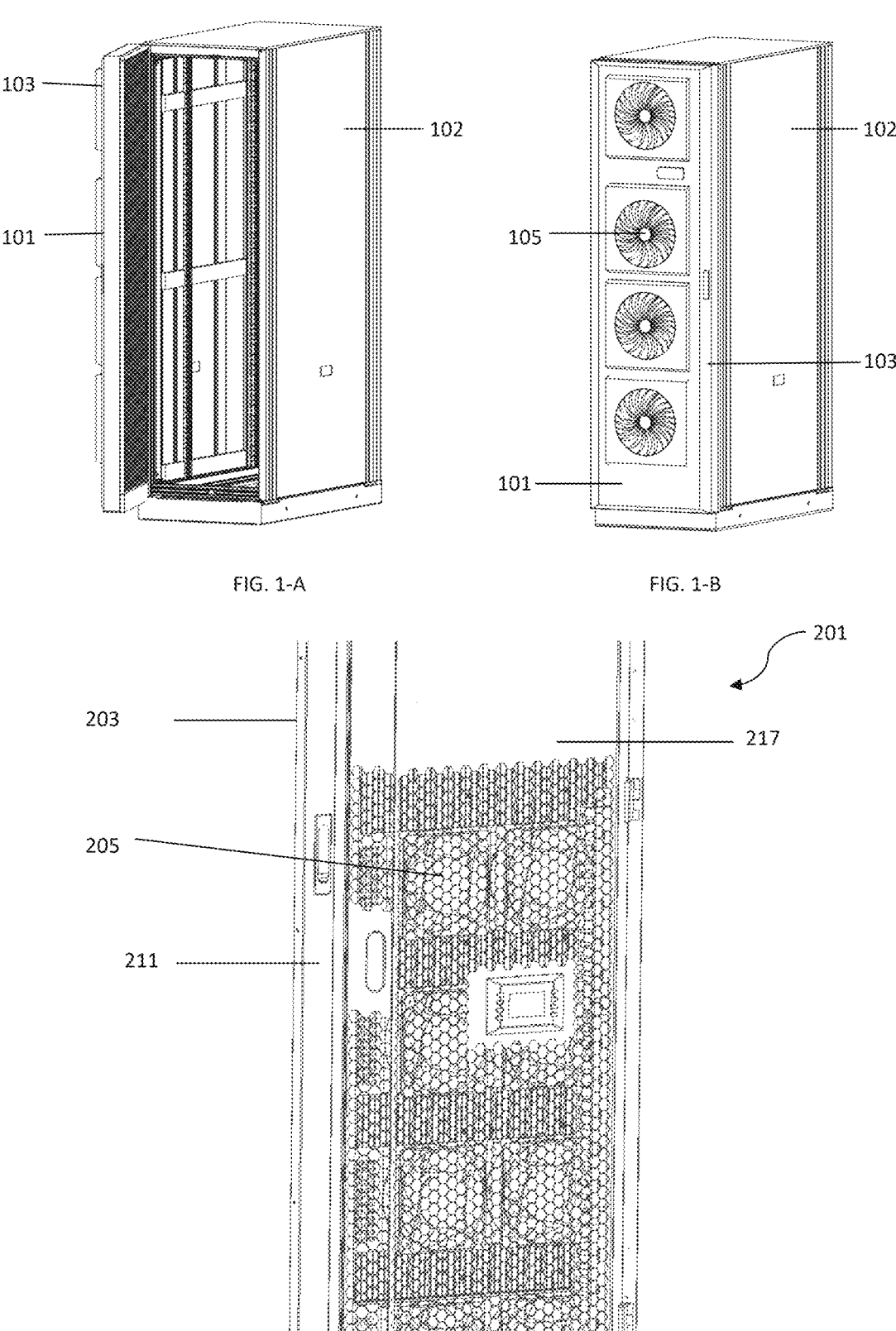
FIG. 2 illustrates an exemplary front view of a system for heat removal from server racks according to the preferred embodiment of the present invention.

In the following detailed description, numerous specific details are set forth in order to provide a thorough understanding of the invention. However, it will be understood by the person having ordinary skill in the art that the invention may be practised without these specific details. In other instances, well known methods, procedures and/or components have not been described in detail so as not to obscure the invention.

The invention will be more clearly understood from the following description of the embodiments thereof, given by way of example only with reference to the accompanying drawings, which are not drawn to scale.

As used in this disclosure and the appended claims herein, the singular forms "a", "an", and "the" include plural referents unless the context clearly dictates or denotes otherwise.

Throughout the disclosure and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment, "such as" is not used in a restrictive sense, but for explanatory purposes.

Present invention discloses a system (201) for heat removal from server racks (102), wherein said server racks are used for storing electronic equipment such as servers. Referring to FIGS. 2, 3, 4-A, said system (1) comprising a back panel (203) wherein said back panel (203) comprises of at least an exhaust fan (205); an inner wall (207) comprising a plurality of perforations (207*a*) to allow air to pass; a plurality of side walls (209); and an outer wall (211) comprising at least a recess (211*a*) for the attachment of said exhaust fan (205), wherein said exhaust fan (205) is attached to a frame (213) extending from the side wall (209) in the recess (211*a*). Said exhaust fan (205) is a detachable exhaust fan (205) whereby it can be detached or removed from said frame (213). This will solve a significant problem faced by the prior art as shown in FIG. 1-B, whereby the user is required to replace the whole back panel (103), or even the entire heat removal system (101) when one of the exhaust fans (105) is faulty. By having the detachable exhaust fans (205), user is only required to replace the faulty exhaust fan (205) instead of replacing the entire heat removal system (101) or entire back panel (103). It is contemplated that the back panel (203) may optionally be without the recess (211*a*) or the frame (213), wherein the exhaust fans (205) are attached directly to the back panel (203).

It is known in the art that air flow flows from the front of the server racks (102) to the back of the server racks (102) wherein one or more fans may be associated with the servers in the server racks (102) to create that air flow or increase air flow. Hence the purpose of the exhaust fans (205) of present invention is to assist the server fans to maintain and supplement air flow from the back of the server racks (102) to the environment. As the purpose of the exhaust fans (205) is to assist, maintain or supplement airflow, the exhaust fans have less capacity and are durable than the conventional powerful exhaust fans (205) as employed in FIG. 1-B, hence consuming less electricity. By having the exhaust fans (205) of present invention, the power consumption is reduced while maintaining the air flow rate, which will be discussed in detail later.

Said back panel (203) further comprises of at least a heat exchanger (215) provided within the back panel (203), particularly said heat exchanger (215) is surrounded by said inner and side walls (207, 209) therein, receiving a cooling fluid such as chilled water, refrigerant, or air, wherein said cooling fluid is supplied to each server rack (102). It is envisaged that the plurality of perforations (207*a*) of inner wall (207) may optionally be replaced with a recess or opening, wherein in this scenario, the inner wall (207) is a frame housing said heat exchanger (215). FIG. 4-B shows an enlarged view of FIG. 4-A to illustrate the perforations (207*a*). FIG. 4-C shows a view of inner wall with the perforations removed to illustrate the heat exchanger (215).

Said back panel (203) further comprises of at least one second layer (217) covering said back panel (203) with at least a hinge (219) wherein said second layer (217) comprises of a plurality of perforations (217*a*) to allow air to disperse to the environment from said server rack (102) through said back panel (203). The back panel (203) and second layer (217) are arranged such that air from the back portion of the server rack (102) flows through the inner wall (207) of said back panel (203), to the heat exchanger (215), to the exhaust fans (205), and eventually to the second layer (217) before flowing to the environment. FIG. 3 shows the second layer (217) is opened up from the back panel (203). The perforation (217*a*) of the second layer (217) is of any suitable shape, size and amount, as long as able to allow air flows out from said server rack (102). Preferably, the perforations (205) are substantially distributed on said second layer (217) and the perforated second layer (217) is covering the back panel (203) in a way that the areas around and in between the fans or the "off-blade areas" outside the circular fan blades (as demarcated by letter X in FIG. 3) are not concealed, whereby it provides a visible sight on the exhaust fans (205), the recess (211*a*), and the heat exchanger (215), as illustrated in FIG. 2. The second layer (217) is designed to maximize air flow rate of the entire server rack (102) and to maintain the momentum of air flow whereby there may be air flow flowing to the areas around and in between the fans or the "off-blade areas" outside the circular fan blades (as demarcated by letter X in FIG. 3) and the air flow is allowed to flow to the environment through the perforated second layer (217) without being impeded. Hence, the perforated second layer (217) acts as an outlet or vent to allow the free passage of the air flow at these "off-blade areas" (X). The second layer (217) of the back panel (203) is also used for monitoring and security purpose, whereby the status of exhaust fans (205) is visible to an operator and the safety of operators can be ensured as well as to protect the exhaust fans (205) from being damaged. It is also envisaged that the back panel may optionally be without the second layer (217), whereby the perforations (217*a*) of said second layer (217) may be integrated or combined into said back panel (203), thereby covering the areas around and in between the fans or the "off-blade areas" outside the circular fan blades (as demarcated by letter X in the figures), while achieving the same air flow effect as if having the perforated second layer (217).

This will solve the significant problem faced by the conventional heat removal system (101) as employed in FIG. 1-A whereby the airflow environment is impeded due to the absence of air flow management system. This will also solve the significant problem faced by the conventional heat removal system (101) as employed in FIG. 1-B whereby the airflow environment is impeded by a closed-off or covered back panel (103). The closed-off panel (103) is concealing the areas around and in between the fans or the "off-blade areas" outside the circular fan blades) in such a way that the momentum of air flow is slowed down and the entire air flow must go through only the fans (105). Although the panel (103) concealing the "off-blade areas" (X) may be useful in eliminating the possibility of having air flow recirculation, but as mentioned above, such system (101) requires powerful and high capacity fans as the entire air flow must go through the fan-blade areas. Even so, investigation has shown that the air flow is still impeded.

Investigation has been done with the objective to determine and compare the amount of air flow between server racks (102) with heat removal system (101) employed in FIG. 1-B and server racks (102) with the heat removal system (201) of present invention. This investigation is shown in FIGS. 5-A to 5-C wherein FIG. 5-A illustrates a server system without heat removal module, FIG. 5-B illustrates a server system with conventional heat removal system (101) as employed in FIG. 1-B, and FIG. 5-C illustrates a server system with the heat removal system (201) of present invention. With the fan power factor (p) at 1.00, it is observed that the server system with conventional heat removal system (101) as employed in FIG. 1-B shows a velocity distribution of 3000 m3/h which is 13.1% reduction as compared to the uniform velocity of 3452 m3/h of server system without heat removal module, whereas the present invention shows a velocity distribution of 3170 m3/h which is only 8.2% of reduction as compared to the uniform velocity of 3452 m3/h of server system without heat removal module. It can be further deduced that the present invention provides approximately 5% more of air flow than the conventional heat removal system (101). Furthermore, there is no recirculation of air flow observed in the present invention. Moreover, the power consumption is also monitored throughout the investigation, whereby the power consumption of the present invention is reduced almost 50% as compared to the conventional heat removal system (101) with exhaust fans (105) as employed in FIG. 1-B.

FIGS. 6-A and 6-B show another embodiment of the invention in top view and isometric view respectively, wherein said back panel (203) may further comprise a plurality of air guiding means (227) to guide or direct the air flow to flow from the server rack (102) towards the exhaust fans (205). Said plurality of air guiding means (227) is angularly fixed or hung or attached at regular or irregular intervals at the inner wall (207) of the back panel (203), in a substantially vertical, horizontal or diagonal manner or etc or any combination thereof. Said plurality of air guiding means (227) includes but not limited to air vents, louvers, curtains, blinds, partitions, fins, wings, or slats, or any combinations thereof or any air guiding means (227) that the system (201) deemed fit. It is contemplated that the plurality of air guiding means (227) is adjustable, wherein it is manually or automatically pivotable to provide a guiding angle with respect to the inner wall (207) of said back panel (203). Each air guiding means (227) among said plurality of air guiding means (227) may have different guiding angles with respect to said back panel (203). The guiding angle is variably proportional to the angle of said back panel (203) with reference to said server rack (102), to allow air flow from said server rack (102) to flow towards said exhaust fan (205). When the back panel (203) is being opened, one of the air guiding means (227) may project at one guiding angle while the other air guiding means (227) may project at another guiding angle or same guiding angle. It has the advantage that when one of the exhaust fans (205) is faulty, the plurality of air guiding means (227) can be manually or automatically adjusted at a guiding angle to guide or direct the air flow towards the exhaust fans (205) that are in good condition.

It should be understood that the air guiding means (227) is linked to or controlled by motors or gears (not shown), which in turn regulated by a controller (not shown). A motor or gear may be dedicated to each air guiding means (227). Alternatively, the air guiding means (227) maybe controlled by a single motor or gear.

It should be understood that the system (201) is connectable to any server rack (102) via at least a hinge mechanism (223) to enable the opening and closure of said system (201) relative to the server rack (102).

While the present invention has been shown and described herein in what are considered to be the preferred embodiments thereof, illustrating the results and advantages over the prior art obtained through the present invention, the invention is not limited to those specific embodiments. Thus, the forms of the invention shown and described herein are to be taken as illustrative only and other embodiments may be selected without departing from the scope of the present invention, as set forth in the claims appended hereto. The scope of the invention encompasses numerous alternatives, modifications and the equivalents. Of necessity, there are many alternative ways of configuring and implementing the invention to suit particular installations and environments while providing biological outcomes of differing design.

The invention claimed is:

1. A system for heat removal from a server rack, comprising:
   a back panel comprising an inner wall, a plurality of side walls, an outer wall, at least one exhaust fan, at least one heat exchanger, a plurality of air guiding means, and
   at least one second layer covering the back panel,
   wherein the at least one second layer comprises a plurality of perforations configured to allow air to disperse from the server rack through the back panel,
   the outer wall of the back panel comprises at least one recess configured to attach the exhaust fan, wherein the exhaust fan is attached to a frame extending from at least one of the side walls into the recess, and
   the heat exchanger is surrounded by the inner wall and the side walls, and
   the plurality of air guiding means are angularly attached at regular or irregular intervals to the inner wall of the back panel.

2. The system of claim 1, wherein the air guiding means is configured to be manually or automatically pivotable so as to provide a guiding angle with respect to the inner wall of the back panel so as to guide air flow from the server rack to the exhaust fan.

3. The system of claim 1, wherein a guiding angle with respect to the back panel of each of the air guiding means is configured to be separately adjustable.

4. The system of claim 1, wherein the plurality of air guiding means includes at least one selected from the group consisting of air vents, louvers, curtains, blinds, fins, wings, and slats.

5. The system of claim 1, wherein the perforation of the second layer is substantially distributed, and are configured such that the at least one exhaust fan, the recess, the heat exchanger, areas around and between the at least one exhaust fan, off-blade areas, which are areas outside of a circle demarcated by blades of the at least one exhaust fan, are visible through the second layer.

6. The system of claim 1, wherein the system is configured to be connected to the server rack via at least one hinge mechanism.

* * * * *